(12) United States Patent
Kawamoto et al.

(10) Patent No.: US 8,913,373 B2
(45) Date of Patent: Dec. 16, 2014

(54) HOUSING AND ELECTRONIC DEVICE

(75) Inventors: Tetsuya Kawamoto, Osaka (JP);
Yoshiaki Nagamura, Osaka (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 13/369,906

(22) Filed: Feb. 9, 2012

(65) Prior Publication Data

US 2012/0206868 A1    Aug. 16, 2012

(30) Foreign Application Priority Data

Feb. 10, 2011 (JP) ................................. 2011-027400

(51) Int. Cl.
*G06F 1/16* (2006.01)
*H05K 9/00* (2006.01)
*G06F 1/18* (2006.01)

(52) U.S. Cl.
CPC ............ *H05K 9/0045* (2013.01); *G06F 1/1616* (2013.01); *G06F 1/1637* (2013.01); *G06F 1/181* (2013.01)
USPC .. 361/679.01; 174/260; 362/486; 312/334.46

(58) Field of Classification Search
USPC .................. 361/232, 679.01, 679.21, 679.06, 361/679.27, 679.54, 679.26, 679.28, 361/679.55, 679.57, 679.56, 679.43, 361/679.09, 679.41, 679.05, 679.11, 361/679.25, 679.4, 679.02; 174/252, 257, 174/255, 266, 388, 358, 261, 117 F, 2, 260, 174/133 R, 126.1; 210/446; 362/473, 294, 362/296.04, 249.05, 486; 312/223.1, 223.2, 312/223.3, 236, 405, 311, 334.1, 333, 312/334.46, 334.47
See application file for complete search history.

(56) References Cited

U.S. PATENT DOCUMENTS

| | | | | |
|---|---|---|---|---|
| 8,154,844 B2 * | 4/2012 | Brown | | 361/232 |
| 2009/0061242 A1 * | 3/2009 | Miller et al. | | 428/457 |
| 2009/0268479 A1 * | 10/2009 | Lunde | | 362/473 |
| 2012/0292247 A1 * | 11/2012 | Moon et al. | | 210/446 |

FOREIGN PATENT DOCUMENTS

| | | |
|---|---|---|
| GB | 2290045 | 12/1995 |
| JP | 63-303732 | 12/1988 |
| JP | 08-066989 | 3/1996 |
| JP | 2004-209717 | 7/2004 |
| JP | 2005-150668 | 6/2005 |
| JP | 2006-049878 | 2/2006 |

* cited by examiner

*Primary Examiner* — Hung Duong
(74) *Attorney, Agent, or Firm* — Hamre, Schumann, Mueller & Larson, P.C.

(57) ABSTRACT

Provided are a housing and an electronic device that ensure sufficient strength even when reduced in thickness. A carbon fiber layer included in the housing is disposed such that the orientation direction of carbon fibers is perpendicular to the lengthwise direction of the long sides of a back face panel, thus enabling improving the flexural strength of the back face panel. This enables increases in the number of carbon fibers per unit of area of the back face panel, and enables the length of each carbon fiber to be reduced. Accordingly, it is possible to cause the carbon fibers to flex less readily, thus enabling improving the strength in the flexing direction of the back face panel.

3 Claims, 16 Drawing Sheets

US 8,913,373 B2

HOUSING AND ELECTRONIC DEVICE

BACKGROUND OF THE INVENTION

1. Field of the Invention

The present invention relates to a housing and an electronic device.

2. Description of Related Art

In recent years, various innovations have been made in order to improve the strength of housings for mobile electronic devices such as notebook personal computers (hereinafter, referred to as "notebook PCs"). One example of a configuration for improving the strength of a housing is disclosed in Patent Literature 1 (JP 2005-150668A).

A material containing a carbon fiber reinforced plastic as a main component is used for the electronic device housing disclosed in Patent Literature 1. This material is made up of multiple layers, and the carbon fibers included in the outermost layer are continuous long fibers that are oriented in one direction. Also, the carbon fibers included in the outermost layer are oriented in a direction that is oblique to the outer edge of the material.

However, with the configuration disclosed in Patent Literature 1, in which the carbon fibers are oriented in a direction oblique to the outer edge of the material, both ends of the carbon fibers disposed near the center of the housing are disposed on the diagonal lines of the housing or in the vicinity of the diagonal lines, and the overall length of the carbon fiber material increases. Since carbon fibers flex more readily as their overall length increases, it is difficult to ensure sufficient strength for the housing. In other words, with the configuration disclosed in Patent Literature 1, it is difficult to ensure sufficient flexural strength for the carbon fiber material disposed near the center of the housing.

SUMMARY OF THE INVENTION

A housing according to the present invention is a housing including a carbon fiber layer that contains a carbon fiber reinforced plastic, the carbon fiber layer being configured having a planar shape that has at least a pair of long sides, and containing carbon fibers that have one orientation direction. The carbon fiber layer is disposed such that the orientation direction of the carbon fibers is perpendicular to a lengthwise direction of the long sides.

An electronic device according to the present invention includes the above-described housing.

According to the present invention, it is possible to provide a housing and an electronic device that enable sufficient strength to be ensured even when reduced in thickness.

DETAILED DESCRIPTION OF THE INVENTION

Hereinafter, the present invention will be described by way of illustrative embodiments with reference to the drawings.

Embodiment 1

1. Electronic Device Configuration

Figure 1A:
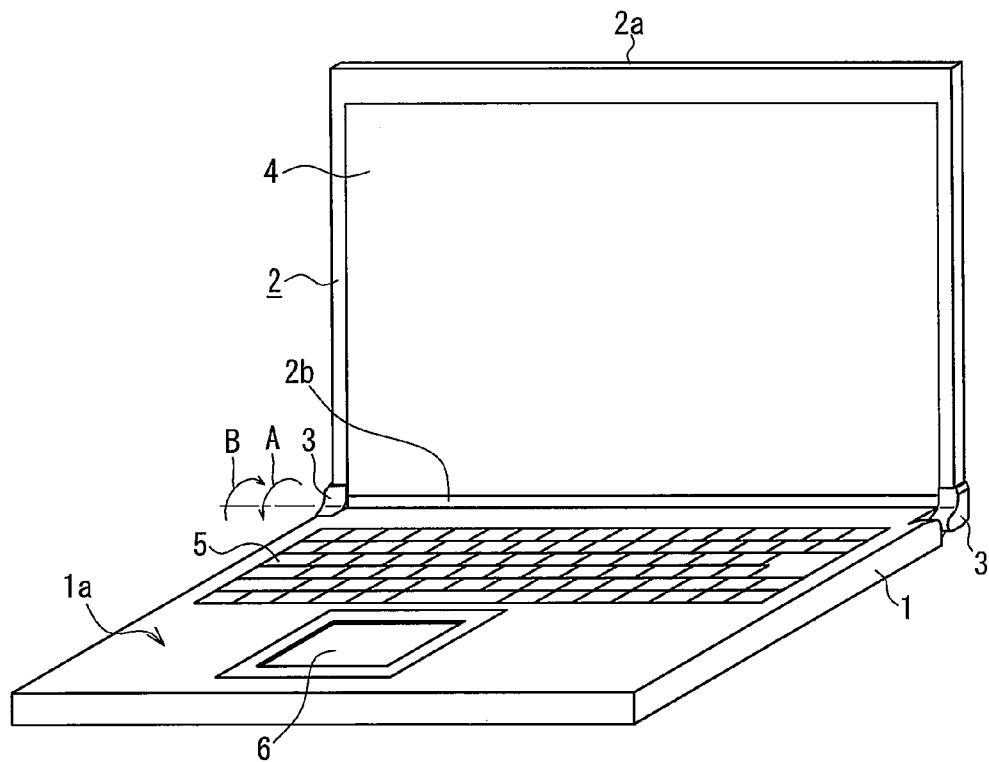
FIG. 1A is a perspective view of a notebook personal computer.
Figure 1B:
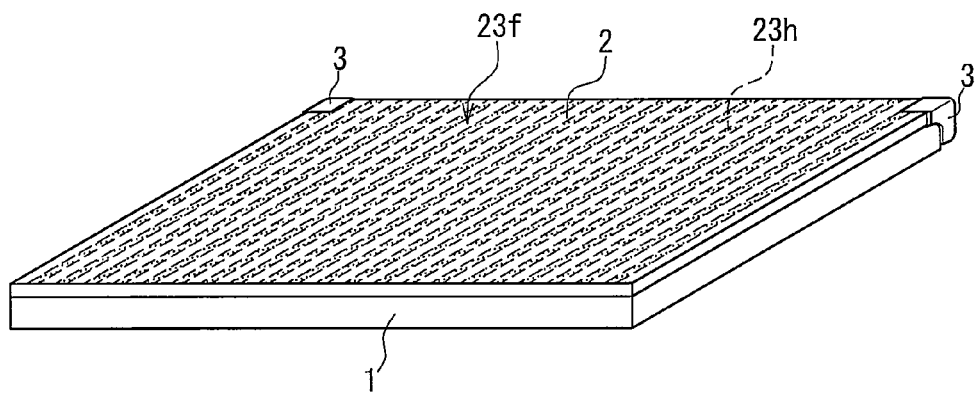
FIG. 1B is a perspective view of the notebook personal computer.

FIGS. 1A and 1B are perspective views of the exterior of a notebook PC according to the present embodiment. Note that although a notebook PC is taken as an example of an electronic device in the present embodiment, the electronic device may be another electronic device as long as it is provided with a housing that includes at least carbon fibers. In particular, an electronic device for which high resistance to drop impact and the like is required, such as a mobile electronic device, is preferable.

As shown in FIG. 1A, the notebook PC includes a first housing 1 and a second housing 2. Circuit boards on which various types of electrical elements are provided, a hard disk drive, and the like are housed in the first housing 1. The second housing 2 includes a display panel 4. The display panel 4 can be embodied by a liquid crystal display (LCD) panel, for example. The first housing 1 and the second housing 2 are supported by a hinge portion 3 so as to be capable of opening and closing with respect to each other by pivoting. FIG. 1A shows the state in which the second housing 2 has been opened up from the first housing 1. FIG. 1B shows the state in which the second housing 2 has been closed down onto the first housing 1. The hinge portion 3 includes a shaft (not shown) that supports the first housing 1 and the second housing 2 so as to be capable of opening and closing.

A keyboard 5 and a pointing device 6 are disposed on an upper face 1a of the first housing 1. The keyboard 5 accepts operations performed by a user for inputting various types of characters. The pointing device 6 is a device for accepting contact operations performed by the user on the operation face thereof, and enables an operation for moving a cursor displayed on the display panel 4 to a desired position.

As shown in FIG. 1B, the second housing 2 includes carbon fibers 23h that are oriented in a predetermined direction. Note that the specific configuration of the second housing 2 will be described below.

2. Second Housing Configuration

Figure 2:
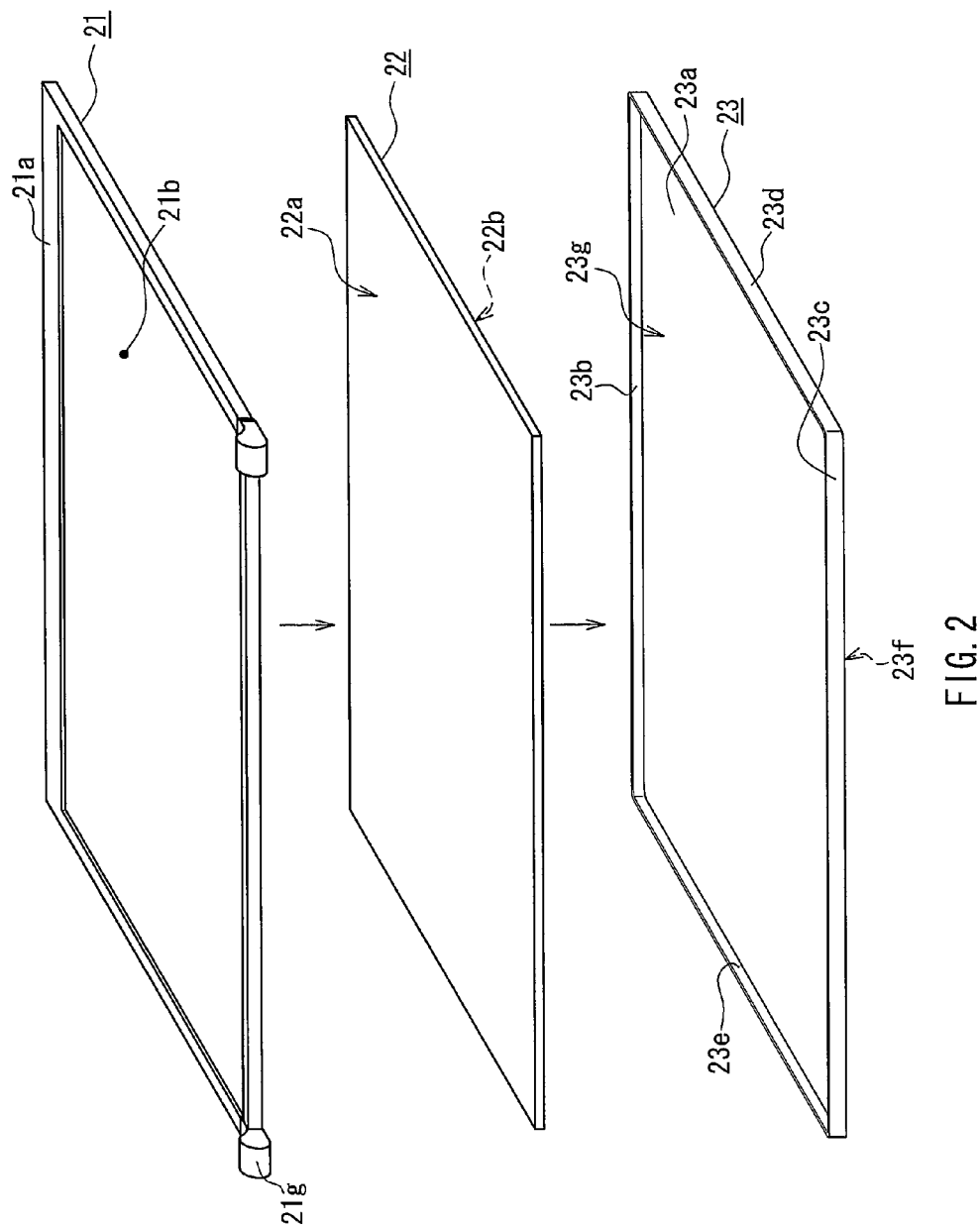
FIG. 2 is an exploded perspective view of a second housing.

FIG. 2 is an exploded perspective view of the second housing 2. As shown in FIG. 2, the second housing 2 mainly includes a front face panel 21, a display panel 22, and a back face panel 23.

The front face panel 21 is formed such that the planar shape thereof is substantially rectangular. The front face panel 21 includes a frame portion 21a and an opening portion 21b. The frame portion 21a defines the size and shape of the opening portion 21b. The opening portion 21b makes it possible for images displayed in an effective display area of the display panel 22 to be viewed from the outside.

The display panel 22 is formed such that the planar shape thereof is rectangular. The display panel 22 corresponds to the display panel 4 shown in FIG. 1A. In the present embodiment, a liquid crystal display panel is employed as the display panel 22. The display panel 22 is sandwiched between the front face panel 21 and the back face panel 23. The display panel 22 can display display images on a front face 22a side thereof. The display panel 22 is disposed such that the front face 22a opposes the front face panel 21, and a back face 22b opposes the back face panel 23.

The back face panel 23 is formed such that the planar shape thereof is rectangular. The back face panel includes a flat plate portion 23a, a first wall portion 23b, a second wall portion 23c, a third wall portion 23d, and a fourth wall portion 23e. The flat plate portion 23a is formed such that the planar shape thereof is rectangular. The flat plate portion 23a is formed such that the size of a principal face 23g thereof is greater than that of at least the back face 22b of the display panel 22. The flat plate portion 23a can cover the back face 22b of the display panel 22. The first wall portion 23b, the second wall portion 23c, the third wall portion 23d, and the fourth wall portion 23e are provided upright on the four sides surrounding the flat plate portion 23a, and the mutually adjacent wall portions are joined together. The first wall portion 23b and the second wall portion 23c are in contact with the long sides of the flat plate portion 23a. In other words, the "long sides of the back face panel 23" refers to the outer sides of the flat plate portion 23a with which the first wall portion 23b and the second wall portion 23c are in contact. The third wall portion 23d and the fourth wall portion 23e are in contact with the short sides of the flat plate portion 23a. The first wall portion 23b, the second wall portion 23c, the third wall portion 23d, and the fourth wall portion 23e are joined to the front face panel 21 when the second housing 2 is in the completely assembled state. An outer face 23f is the face on the reverse side of the principal face 23g, and is the face that is exposed to the outside when the second housing 2 is in the completely assembled state.

Figure 3:
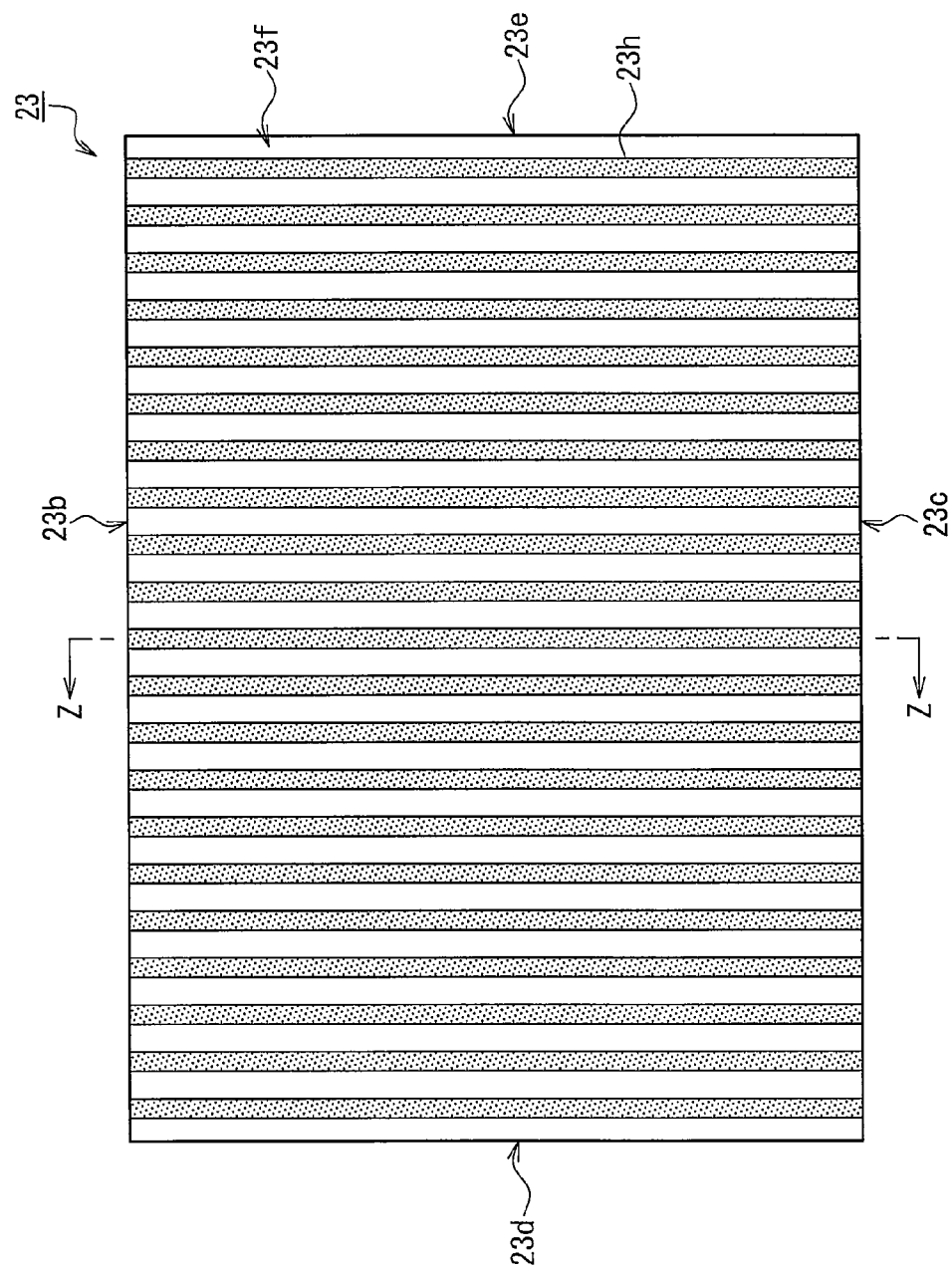
FIG. 3 is a plan view of a second housing according to Embodiment 1.
Figure 4:
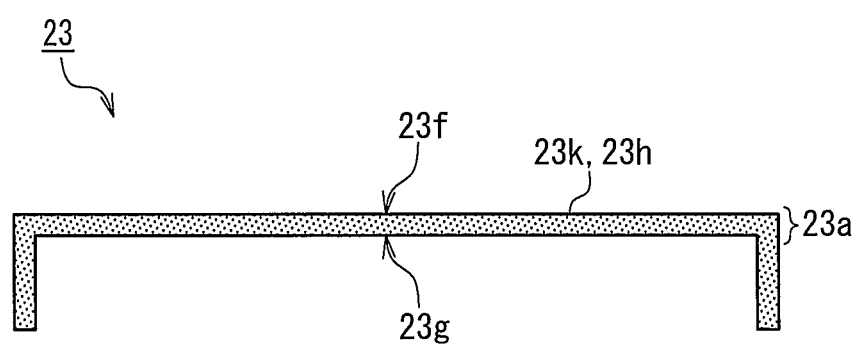
FIG. 4 is a cross-sectional view taken along line Z-Z in FIG. 3.

FIG. 3 is a plan view of the back face panel 23 of Embodiment 1. FIG. 4 is a cross-sectional view taken long line Z-Z in FIG. 3. As shown in FIGS. 3 and 4, the back face panel 23 is configured by a carbon fiber layer 23k.

The carbon fiber layer 23k is configured by a material containing a CFRP (Carbon Fiber Reinforced Plastic) as a main component. Specifically, the carbon fiber layer 23k is a composite material formed by incorporating multiple uniaxially-oriented carbon fibers 23h in a thermosetting resin (e.g., epoxy resin) and then performing thermal curing while stretching the material into a sheet, and this composite material is commercially available in various thicknesses. In the present embodiment, the carbon fiber layer 23k is configured by a material containing 35% epoxy resin and 65% carbon fibers, with a layer thickness of 0.12 mm to 0.17 mm and a carbon fiber filament count of 3000, but these numerical values are merely exemplary. The carbon fiber layer 23k is made up of a commercially-available single-layer material with a thickness of 0.12 mm, for example. The carbon fibers 23h are oriented in one direction, and are long fibers that are continuous in that direction. The carbon fiber layer 23k is configured such that the orientation direction of the carbon fibers 23h is perpendicular to the lengthwise direction of the long sides of the back face panel 23 as shown in FIG. 3 (i.e., parallel to the lengthwise direction of the short sides of the back face panel 23). Specifically, the carbon fibers 23h are arranged on the flat plate portion 23a so as to extend from the first wall portion 23b of the back face panel 23 or the vicinity thereof to the second wall portion 23c or the vicinity thereof. Note that the carbon fibers 23h shown in FIG. 3 are illustrated schematically.

In the present embodiment, the back face panel 23 is configured by the carbon fiber layer 23k, and furthermore the orientation direction of the carbon fibers 23h contained in the carbon fiber layer 23k is set perpendicular to the lengthwise direction of the long sides of the back face panel 23, and this enables the flexural strength of the back face panel 23 to be improved since a greater number of carbon fibers 23h can be provided. Note that "flexure" refers to deformation that the back face panel 23 undergoes due to force applied in a direction orthogonal to the outer face 23f of the back face panel 23.

Also, setting the orientation direction of the carbon fibers 23h so as to be perpendicular to the lengthwise direction of the long sides of the back face panel 23 enables the length of the carbon fibers 23h to be reduced, thus causing the carbon fibers 23h to flex less readily and improving the flexural strength of the back face panel 23.

Also, configuring the back face panel 23 from only the carbon fiber layer 23k enables the weight of the back face panel 23 to be reduced. Furthermore, configuring the back face panel 23 from only the carbon fiber layer 23k enables the cost of the back face panel 23 to be reduced. Moreover, configuring the back face panel 23 from only the carbon fiber layer 23k enables the easy insertion of a decoration such as a logo between the carbon fibers and the thermosetting resin on the outer face surface of the back face panel 23 on the 23f.

Also, providing the back face panel 23 with the first wall portion 23b, the second wall portion 23c, the third wall portion 23d, and the fourth wall portion 23e improves the strength in the planar direction of the principal face 23g and improves the robustness of the second housing 2.

Note that it is preferable that a conductive member made of a metal foil, a metal film, or the like is provided on the principal face 23g and, among the first wall portion 23b, the second wall portion 23c, the third wall portion 23d, and the fourth wall portion 23e of the back face panel 23, the face of at least any one thereof that is on the principal face 23g side. This configuration helps suppress unnecessary radiation generated by drive signals applied to the display panel 22 and the circuits with signal-generating parts mounted thereon that are included in the second housing 2. Also, this configuration enables electrical connection of the conductive member and the electrical circuits included in the second housing 2, and enables grounding of the electrical circuits.

Also, it is preferable that a conductive member made of a metal or the like is provided on the outer face 23f of the back face panel 23. This configuration enables suppression of unnecessary radiation generated by drive signals applied to the display panel 22 and the circuits with signal-generating parts mounted thereon that are included in the second housing 2.

Also, in the case of applying CFRP to the housing, it is conceivable to increase the amount of carbon fibers 23h contained in the thermosetting resin in order to improve the mechanical strength. As a result of increasing the amount of carbon fibers 23h contained in the thermosetting resin, there is an increased tendency for the front face 23f of the CFRP to become rough, and scratching and the like more readily occur. In the case of this configuration, scratch prevention processing can be performed on the outer face 23f of the carbon fiber layer 23k. Note that although it is effective to provide the above-described conductive member as a configuration for protecting the outer face 23f of the carbon fiber layer 23k from scratching and the like, there is no limitation to this configuration, and a configuration is possible in which, for example, a protective member made of a nonconductor such as resin is provided.

Also, although the back face panel 23 is formed such that the planar shape thereof is rectangular in the present embodiment, there is no limitation to being rectangular, and effects of the carbon fiber layer 23k of the present embodiment can be obtained as long as the shape of the back face panel has at least one pair of long sides.

Also, although the carbon fiber layer 23k is provided on the second housing 2 in the present embodiment, providing the carbon fiber layer 23k on the first housing 1 enables improvement in the flexural strength of the first housing 1. Furthermore, providing the carbon fiber layer 23k on both the first housing 1 and the second housing 2 enables improvement in the overall flexural strength of the notebook PC. Moreover, this configuration enables magnetically shielding of a magnetic recording medium such as the hard disk drive included in the first housing 1.

Also, although the carbon fiber layer 23k is provided on the back face panel 23 in the present embodiment, the carbon fiber layer 23k can be provided on the front face panel 21 as well.

Also, although the carbon fiber layer 23k is disposed such that the orientation direction of the carbon fibers 23h is perpendicular to the lengthwise direction of the long sides of the back face panel 23 in the present embodiment, there is no limitation to a configuration in which "perpendicular" refers to the orientation direction of the carbon fibers 23h and the lengthwise direction of the long sides of the back face panel 23 forming an exactly 90-degree angle, and some margin of error in the angle is possible. In other words, when cutting a carbon fiber sheet of an arbitrary size from a carbon fiber sheet (original roll) in order to prepare the carbon fiber layer 23k for example, there are cases where there is a slight error in the cut size. In this case, it is possible for the orientation direction of the carbon fibers 23h and the lengthwise direction of the long sides of the back face panel 23 to not form a 90-degree angle. In the present embodiment, "perpendicular" includes this margin of error in the angle.

Also, the first housing 1, the second housing 2, and the back face panel 23 are examples of a housing. The notebook PC is one example of an electronic device. The carbon fiber layer 23k is one example of a carbon fiber layer. The carbon fibers 23h are one example of carbon fibers. The outer side of the flat plate portion 23a that is in contact with the first wall portion 23b, and the outer side of the flat plate portion 23a that is in contact with the second wall portion 23c are examples of the long sides of the back face panel 23.

Embodiment 2

Figure 5:
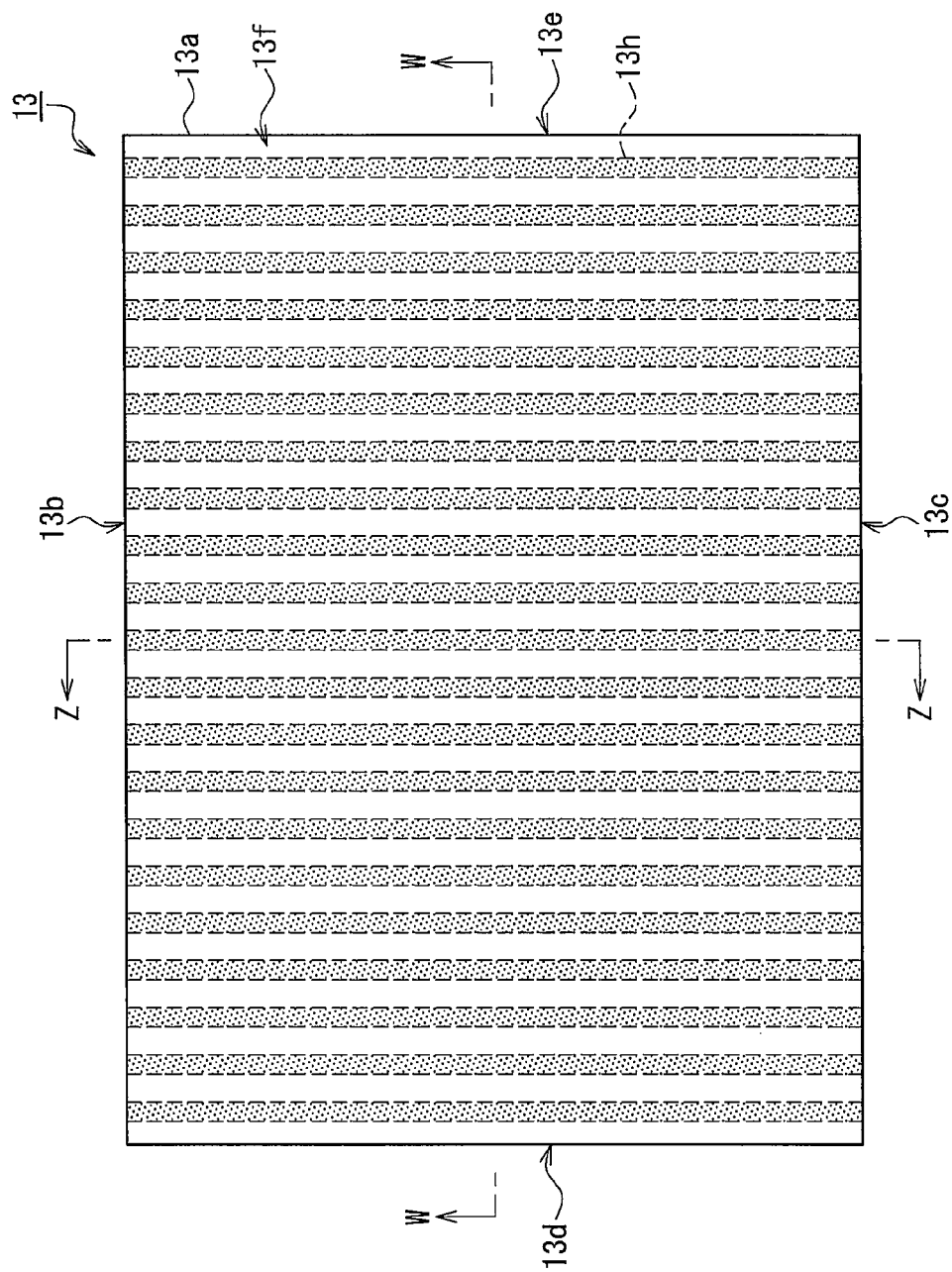
FIG. 5 is a plan view of a second housing according to Embodiment 2.
Figure 6:
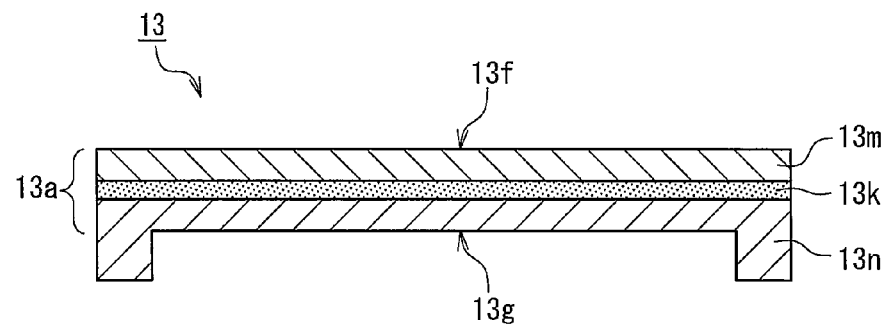
FIG. 6 is a cross-sectional view taken along line Z-Z in FIG. 5.

FIG. 5 is a plan view of a back face panel 13 (outer face 13f side thereof) of Embodiment 2. FIG. 6 is a cross-sectional view taken long line Z-Z in FIG. 5. As shown in FIG. 6, the back face panel 13 has a three-layer structure including a carbon fiber layer 13k as well as a first layer 13m and a second layer 13n that are disposed so as to sandwich the carbon fiber layer 13k.

Note that the back face panel 13 can be applied to the second housing 2 shown in FIGS. 1 and 2. Specifically, the back face panel 13 can be applied instead of the back face panel 23 shown in FIG. 2. Also, aspects of the configuration other than the back face panel 13 are similar to those in Embodiment 1, and therefore detailed descriptions thereof will not be given.

The carbon fiber layer 13k is configured by a material containing a CFRP (Carbon Fiber Reinforced Plastic) as a main component. Specifically, the carbon fiber layer 13k is a composite material formed by incorporating multiple uniaxially-oriented carbon fibers 13h in a thermosetting resin (e.g., epoxy resin) and then performing thermal curing while stretching the material into a sheet, and this composite material is commercially available in various thicknesses. In the present embodiment, the carbon fiber layer 13k is configured by a material containing 35% epoxy resin and 65% carbon fibers, with a layer thickness of 0.12 mm to 0.17 mm and a carbon fiber filament count of 3000, but these numerical values are merely exemplary. The carbon fiber layer 13k is made up of a commercially-available single-layer material with a thickness of 0.12 mm, for example. The carbon fibers 13h are oriented in one direction, and are long fibers that are continuous in that direction. The carbon fiber layer 13k is configured such that the orientation direction of the carbon fibers 13h is perpendicular to the lengthwise direction of the long sides of the back face panel 13 as shown in FIG. 5 (i.e., parallel to the lengthwise direction of the short sides of the back face panel 13). Specifically, the carbon fibers 13h are arranged on a flat plate portion 13a so as to extend from a first wall portion 13b of the back face panel 13 or the vicinity thereof to a second wall portion 13c or the vicinity thereof. Note that the carbon fibers 13h shown in FIG. 5 are illustrated schematically.

The first layer 13m is stacked on and joined to a first principal face of the carbon fiber layer 13k. Although the first layer 13m can be formed from a resin or a metal, it is preferable that the first layer 13m is formed from a high-hardness material due to its being a portion that constitutes the outline of the notebook PC. In the present embodiment, the first layer 13m is formed from magnesium.

The second layer 13n is stacked on and joined to a second principal face of the carbon fiber layer 13k that is on the reverse side of the first principal face. It is preferable that the second layer 13n is formed from a resin or a metal, and in the present embodiment, the second layer 13n is formed from magnesium, for example.

As shown in FIGS. 5 and 6, the carbon fiber layer 13k is provided on the back face panel 13, and furthermore the orientation direction of the carbon fibers 13h contained in the carbon fiber layer 13k is set perpendicular to the lengthwise direction of the long sides of the back face panel 13, and this enables improvement in the flexural strength of the back face panel 13 since a greater number of carbon fibers 13h can be provided. Note that "flexure" refers to deformation that the back face panel 13 undergoes due to force applied in a direction orthogonal to the outer face 13f of the back face panel 13.

Also, setting the orientation direction of the carbon fibers 13h so as to be perpendicular to the lengthwise direction of the long sides of the back face panel 13 enables the length of the carbon fibers 13h to be reduced, thus causing the carbon fibers 13h to flex less readily and improving the flexural strength of the back face panel 13.

The following describes the relationship between the orientation direction of the carbon fibers and the flexural strength of the back face panel that includes the carbon fiber layer.

Figure 7A:
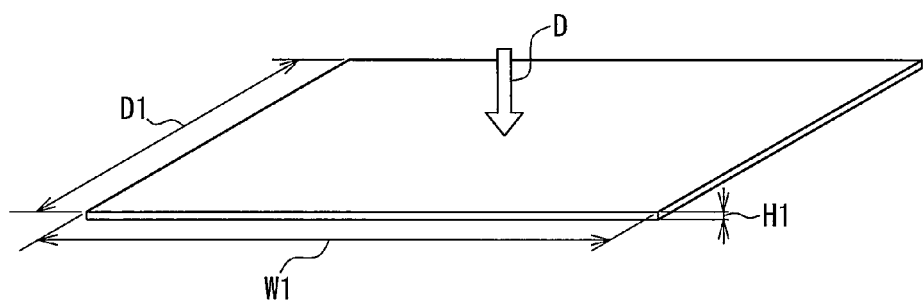
FIG. 7A is an illustrative diagram showing a flexural strength test performed on the second housing.
Figure 7B:
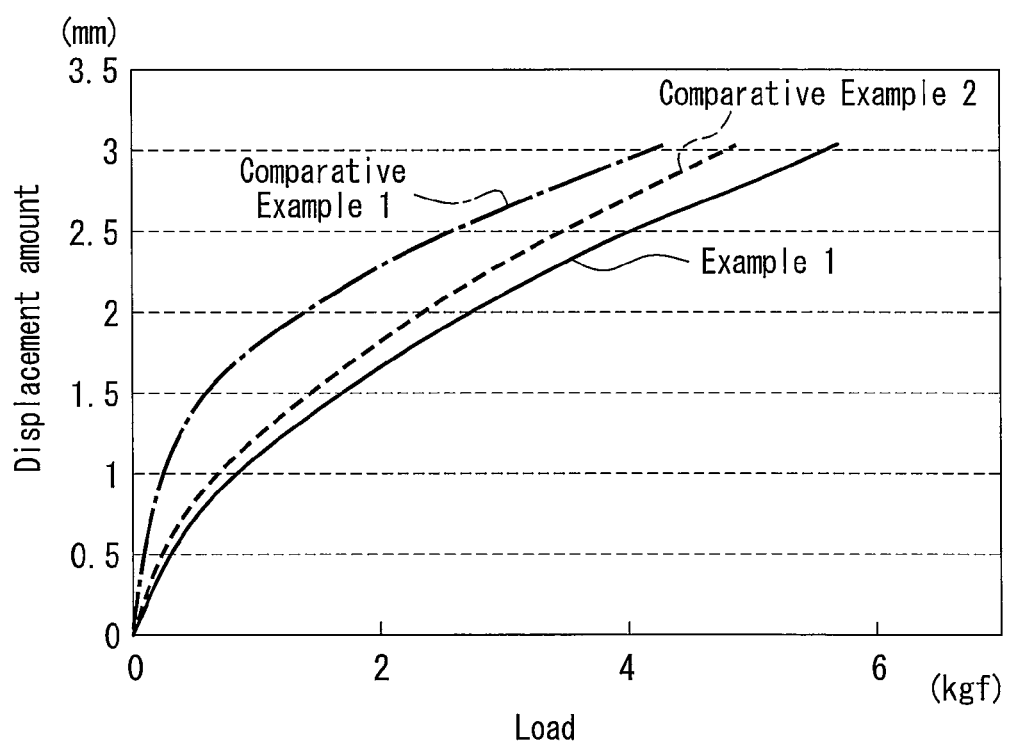
FIG. 7B is a graph of results of the flexural strength test performed on the second housing.
Figure 8:
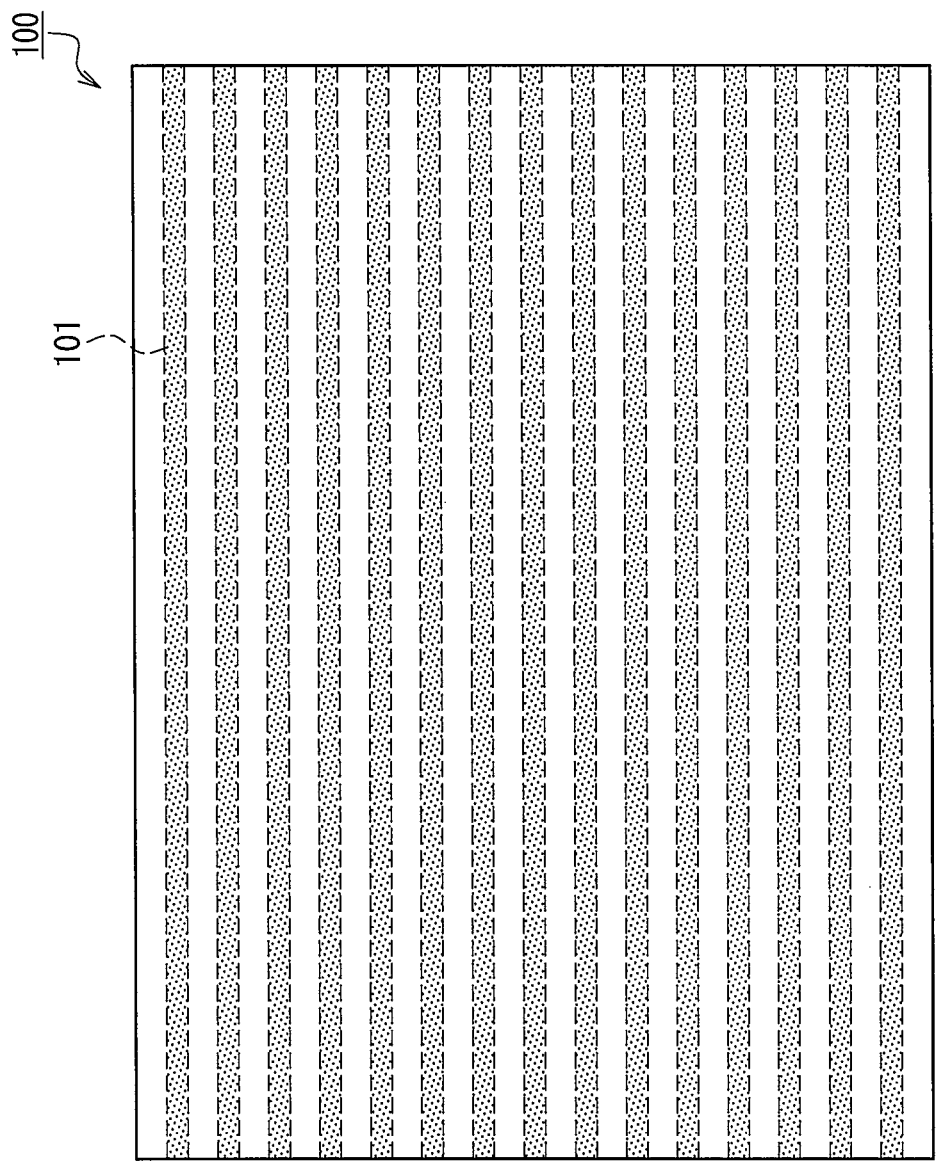
FIG. 8 is a plan view of a second housing according to Comparative Example 1.
Figure 9:
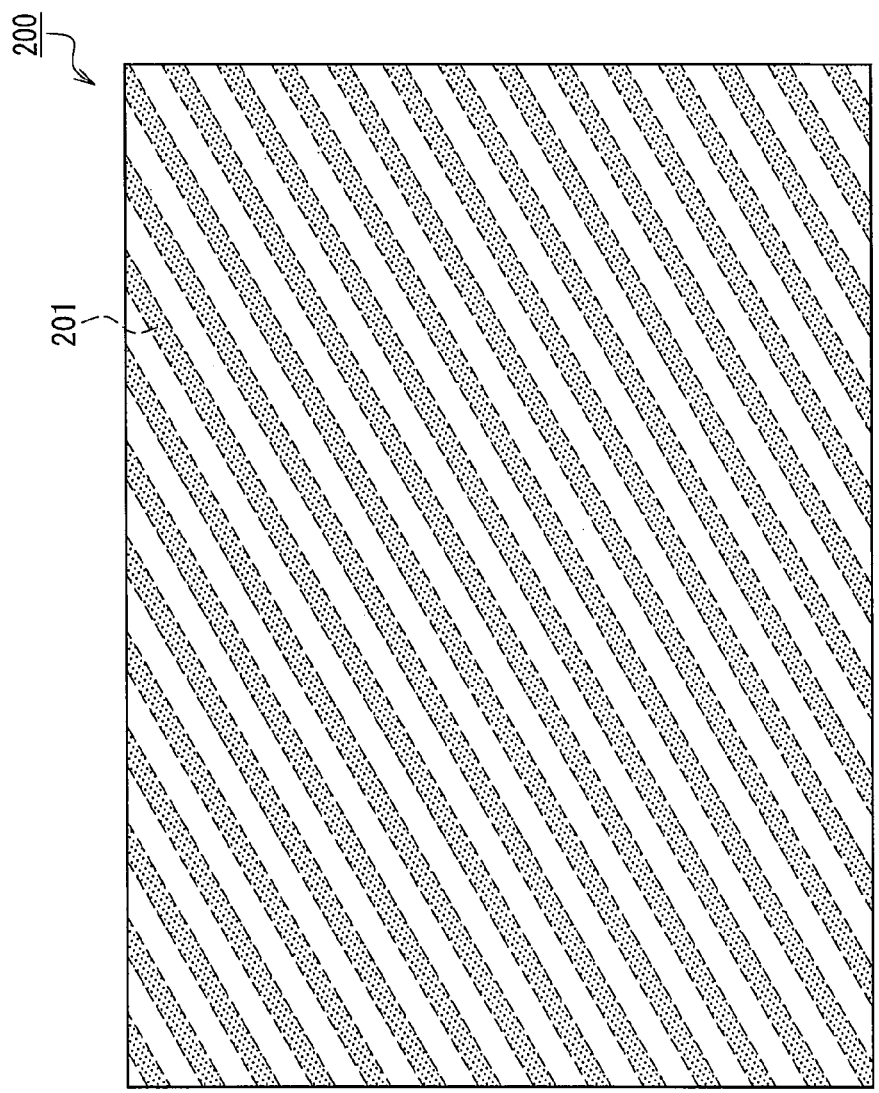
FIG. 9 is a plan view of a second housing according to Comparative Example 2.

FIG. 7A is an illustrative diagram showing an overview of a method for testing the strength of the back face panel. FIG. 7B is a graph showing the results of the test. FIG. 8 is a plan view of the back face panel of Comparative Example 1. FIG. 9 is a plan view of the back face panel of Comparative Example 2.

The back face panels used in the strength test were the back face panel 13 (Example 1) shown in FIG. 5, a back face panel 100 (Comparative Example 1) shown in FIG. 8, and a back face panel 200 (Comparative Example 2) shown in FIG. 9.

The back face panel 13 of Example 1 was provided with a carbon fiber layer disposed such that the orientation direction of the carbon fibers was perpendicular to the lengthwise direction of the long sides of the back face panel 13. The back face panel 100 of Comparative Example 1 was provided with a carbon fiber layer disposed such that the orientation direction of carbon fibers 101 was parallel to the lengthwise direction of the long sides of the back face panel 100. The back face panel 200 of Comparative Example 2 was provided with a carbon fiber layer disposed such that the orientation direction of carbon fibers 201 was oblique to the lengthwise direction of the long sides of the back face panel 200. The back face panels 13, 100, and 200 were configured including a carbon fiber layer with a thickness of 0.12 mm, a first aluminum layer with a thickness of 0.2 mm, and a second aluminum layer with a thickness of 0.2 mm, with the carbon fiber layer being sandwiched between the first aluminum layer and the second aluminum layer to form a laminate. Also, the back face panels 13, 100, and 200 were formed such that the planar shape thereof was rectangular, and had a flat plate shape with a depth dimension D1 of 182 mm, a width dimension W1 of 277 mm, and a thickness dimension H1 of 0.52 mm. Also, specifications such as the carbon fiber filament count, density, and tensile strength were all the same for the carbon fiber layers included in the back face panels 13, 100, and 200. In other words, the carbon fiber layers included in the back face panels 13, 100, and 200 were prepared by using different cutting methods when the carbon fiber sheets to be used as the carbon fiber layers were cut out of one type of carbon fiber sheet (original roll).

The flexural strength of the back face panels 13, 100, and 200 configured as described above was measured using a predetermined measuring apparatus. Specifically, as shown in FIG. 7A, the four surrounding sides of the back face panels were fixed, a constant weight was applied focused in the direction indicate by arrow D in the center of the outer face (e.g., the outer face 13f shown in FIG. 2), and the amount of deformation in the vicinity of the center of the back face panel was measured. The amount of deformation was obtained by measuring the distance between the position of the outer face of the back face panel when no weight was applied and the position of the outer face of the back face panel when the constant weight was applied. As a result, as shown in FIG. 7B, the amount of deformation when the constant weight was applied to the back face panels was the least for the back face panel 13 of Example 1 among the three types of back face panels. Also, the amount of deformation of the back face panel 200 of Comparative Example 2 was higher than the amount of deformation of the back face panel 13 of Example 1. Moreover, the amount of deformation of the back face panel 100 of Comparative Example 1 was higher than the amount of deformation of the back face panel 200 of Comparative Example 2. In other words, it was found that the back face panel 13 of Example 1 had the highest flexural strength among the three types of back face panels.

3. Effects of the Embodiment and Other Remarks

According to the present embodiment, providing the carbon fiber layer 13k disposed such that the orientation direction of the carbon fibers 13h is perpendicular to the lengthwise direction of the long sides of the back face panel 13 enables improving the flexural strength of the back face panel 13. Specifically, due to orienting the carbon fibers 13h so as to be perpendicular to the lengthwise direction of the long sides of the back face panel 13, the number of carbon fibers 13 provided on the back face panel 13 can be greater than that in Comparative Example 1 (e.g., see FIG. 8) in which the carbon fibers are oriented so as to be parallel with the lengthwise direction of the long sides of the back face panel, thus enabling improved flexural strength of the back face panel 13. Also, due to orienting the carbon fibers 13h so as to be perpendicular to the lengthwise direction of the long sides of the back face panel 13, the length of the carbon fibers 13h can be reduced, thus enabling causing the carbon fibers 13h to flex less readily and improving the flexural strength of the back face panel 13.

Also, according to the present embodiment, the carbon fiber layer 13k is a thin layer with a thickness of approximately 0.12 mm to 0.17 mm, and therefore even if the back face panel 13 is provided with the carbon fiber layer 13k, the increase in the overall thickness of the back face panel 13 is not significant, thus enabling improved flexural strength while maintaining the thickness of the second housing 2.

Also, according to the present embodiment, the strength of the back face panel 13 can be ensured even if the long sides of the second housing 2 and the back face panel 13 are lengthened in order for the aspect ratio of the effective display area of the display panel 4 to be made wider (e.g., to an aspect ratio of 16:9) than the aspect ratio that has often be employed in the display panels of conventional notebook PCs. Specifically, in the case where the long sides of the second housing 2 and the back face panel 13 are lengthened without the short sides being changed from those of conventional technology, with the Comparative Example 1 (e.g., see FIG. 8) in which the carbon fibers are oriented so as to be parallel with the lengthwise direction of the long sides of the back face panel, the carbon fibers simply increase in length and do not increase in number. When the carbon fibers increase in length, the carbon fibers each flex more readily, and the flexural strength of the back face panel decreases. In contrast, with the present embodiment, in the case where the long sides of the second housing 2 and the back face panel 13 are lengthened, the length of each carbon fiber 13h does not change, but the number of carbon fibers 13h increases. In other words, with the back face panel 13 of the present embodiment, the flexural strength of each carbon fiber 13h can be maintained since the length of each carbon fiber 13h does not change, and the number of carbon fibers 13h increases, thus improving the flexural strength. Accordingly, with the present embodiment, the flexural strength of the back face panel 13 can be ensured even if the long sides of the second housing 2 and the back face panel 13 are lengthened.

Also, in the present embodiment, providing the second housing 2 with the carbon fiber layer 13k enables reducing curvature deformation of the second housing 2 when the second housing 2 is pivoted in the direction indicated by arrow A or arrow B with the respect to the first housing 1. Specifically, when the user opens and closes the second housing 2 in the direction indicated by the arrow A and the arrow B, the user often grips a first long side portion 2a of the second housing 2. Since a second long side portion 2b of the pair of long sides of the second housing 2 is joined to the first housing 1 via the hinge portion 3, there are cases where the second housing 2 undergoes curvature deformation in which the short sides flex when the user grips the first long side portion 2a and opens or closes the second housing 2. In particular, in the case where the torque (open/close load) of the hinge mechanism included in the hinge portion 3 is high, there is an increased possibility of the short sides of the second housing 2 undergoing curvature deformation. In this case, if the flexural strength of the back face panel 13 is low, the second housing 2 undergoes a large amount of curvature deformation, and there is the possibility of damage such as cracking of the display panel 22. In the present embodiment, the back face panel 13 is provided with the carbon fiber layer 13k, and furthermore the orientation direction of the carbon fibers 13h included in the carbon fiber layer 13k is set parallel with the lengthwise direction of the short sides of the back face panel 13, thus enabling improving the flexural strength in the lengthwise direction of the short sides of the second housing 2 and suppressing curvature deformation. Accordingly, the present embodiment enables suppressing of curvature deformation when the user grips the long side portion 2a and opens or closes the second housing 2, and preventing damage to the display panel 22, for example.

Also, according to the present embodiment, providing the carbon fiber layer 13k disposed such that the orientation direction of the carbon fibers 13h is perpendicular to the lengthwise direction of the long sides of the back face panel 13 enables improved yield when manufacturing the back face panel 13. Specifically, a carbon fiber sheet of an arbitrary size that has been cut out from a large-size carbon fiber sheet (original roll) generally wound into a roll is used as the carbon fiber layer 13k. With a carbon fiber sheet wound into a roll, it is often the case that the carbon fibers are oriented so as to be parallel with or perpendicular to the winding shaft, and therefore only a small portion needs to be discarded when cutting out the carbon fiber layer 13k of the present embodiment that is disposed such that the orientation direction of the carbon fibers 13h is perpendicular to the lengthwise direction of the long sides of the back face panel 13, and the yield can be improved. On the other hand, in the case of the carbon fiber layer disposed such that the orientation direction of the carbon fibers 201 is oblique to the lengthwise direction of the long sides of the back face panel 200 as shown in FIG. 9, a large portion is discarded when the carbon fiber sheet to be used as the carbon fiber layer is cut out from the above-described carbon fiber sheet, and there are cases where the yield decreases.

Note that although the carbon fiber layer 13k is configured including the epoxy resin and the carbon fibers 13h in the present embodiment, the epoxy resin is merely one example of a thermosetting resin, and another material may be used as long as it is a thermosetting resin.

Also, although the back face panel 13 includes the first layer 13m and the second layer 13n that are both made of magnesium as shown in FIG. 6 in the present embodiment, a material other than magnesium can be applied as the material of the first layer 13m and the second layer 13n. Moreover, either the first layer 13m or the second layer 13n can be omitted from the back face panel 13.

Also, although the back face panel 13 is formed such that the planar shape thereof is rectangular in the present embodiment, there is no limitation to the share being rectangular, and effects of the carbon fiber layer 13k of the present embodiment can be obtained as long as the shape of the back face panel has at least one pair of long sides.

Also, although the carbon fiber layer 13k is provided on the second housing 2 in the present embodiment, providing the carbon fiber layer 13k on the first housing 1 enables improved flexural strength of the first housing 1. Furthermore, providing the carbon fiber layer 13k on both the first housing 1 and the second housing 2 enables improved overall flexural strength of the notebook PC.

Also, although the carbon fiber layer 13k is provided on the back face panel 13 in the present embodiment, the carbon fiber layer 13k can be provided on the front face panel 21 as well.

Also, although the carbon fiber layer 13k is disposed such that the orientation direction of the carbon fibers 13h is perpendicular to the lengthwise direction of the long sides of the back face panel 13 in the present embodiment, there is no limitation to a configuration in which "perpendicular" refers to the orientation direction of the carbon fibers 13h and the lengthwise direction of the long sides of the back face panel 13 forming an exactly 90-degree angle, and somewhat of a margin of error in the angle is possible. In other words, when cutting a carbon fiber sheet of an arbitrary size from a carbon fiber sheet (original roll) in order to prepare the carbon fiber layer 13k for example, there are cases where there is a slight error in the cut size. In this case, it is possible for the orientation direction of the carbon fibers 13h and the lengthwise direction of the long sides of the back face panel 13 to not form an exact 90-degree angle. In the present embodiment, "perpendicular" includes this margin of error in the angle.

The back face panel 13 is one example of a housing. The carbon fiber layer 13k is one example of a carbon fiber layer. The carbon fibers 13h are one example of carbon fibers. The first layer 13m and the second layer 13n are examples of a metal layer. The outer side of the flat plate portion 13a that is in contact with the first wall portion 13b, and the outer side of the flat plate portion 13a that is in contact with the second wall portion 13c are examples of the long sides of the back face panel 13.

The following variations can be applied to the present embodiment.

Variation 1

Figure 10:
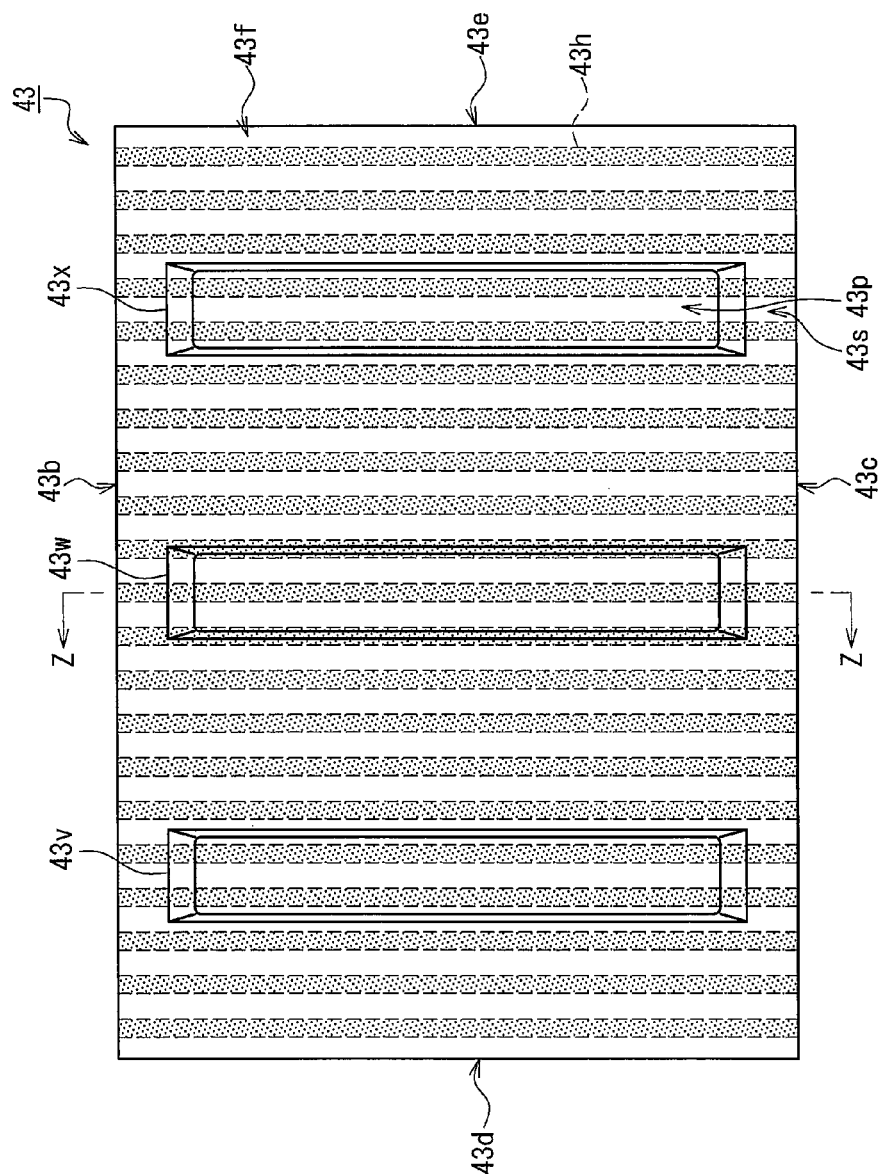
FIG. 10 is a plan view of a second housing according to Variation 1.
Figure 11:
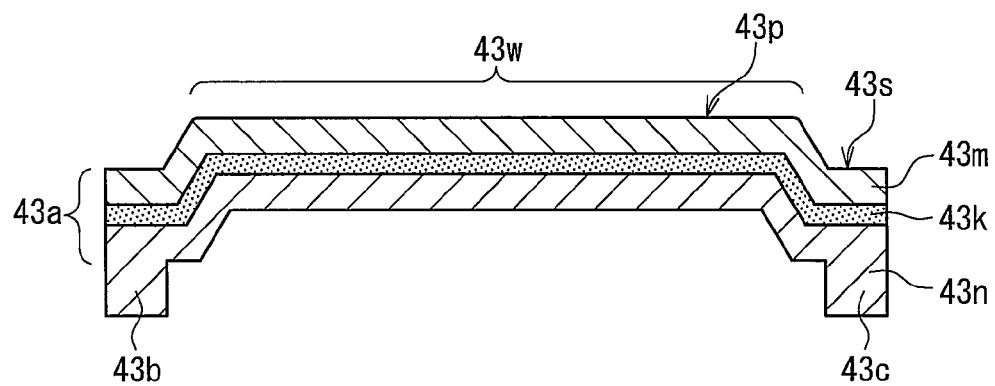
FIG. 11 is a cross-sectional view taken along line Z-Z in FIG. 10.

FIG. 10 is a plan view of the configuration of Variation 1 of the back face panel of the present embodiment. FIG. 11 is a cross-sectional view taken long line Z-Z in FIG. 10.

A back face panel 43 shown in FIGS. 10 and 11 has the configuration of the back face panel 13 shown in FIGS. 5 and 6 with the further inclusion of projection portions 43v, 43w, and 43x. The projection portions 43v, 43w, and 43x are formed so as to project out from an outer face 43f of the back face panel 43. In the present embodiment, the projection portions 43v, 43w, and 43x are formed such that the planar shape thereof is rectangular, but this shape is merely one example. The projection portions 43v, 43w, and 43x are formed such that the lengthwise direction of the long sides thereof is perpendicular to the lengthwise direction of the long sides of the back face panel 43. The projection portions 43v, 43w, and 43x are provided in order to raise the flexural strength of the back face panel 43. The projection portions 43v, 43w, and 43x are formed so as to project out from a principal face 43s of the back face panel 43, and include an upper face 43p at a position that protrudes out from the principal face 43s. In the present embodiment, the upper face 43p is formed such that the planar shape thereof is rectangular. Note that although a projection portion is provided at three places in Variation 1, this number is merely one example.

Carbon fibers 43h are disposed at positions overlapping the projection portions 43v, 43w, and 43x. Also, a carbon fiber layer 43k is disposed such that the orientation direction of the carbon fibers 43h is parallel with the lengthwise direction of the long sides of the projection portions 43v, 43w, and 43x, or more specifically conforms to the lengthwise direction of the upper face 43*p* of the projection portions.

Note that the specific configurations of the carbon fiber layer 43*k* and the carbon fibers 43*h* are similar to the configurations of the carbon fiber layer 13*k* and the carbon fibers 13*h* described with reference to FIGS. 5 and 6. The specific configurations of a first layer 43*m* and a second layer 43*n* are similar to the configurations of the first layer 13*m* and the second layer 13*n* described with reference to FIGS. 5 and 6.

According to this configuration, the flexural strength of the back face panel 43 is improved due to the flexural strength obtained by the carbon fibers 43*h* and the improvement in flexural strength obtained by forming the projection portions 43*w*, 43*v*, and 43*x*.

Note that although the carbon fiber layer 43*k* is a single layer in the configuration shown in FIGS. 10 and 11, providing multiple carbon fiber layers whose orientation directions are mutually orthogonal enables further improved flexural strength for the back face panel 43.

Also, the flexural strength of the back face panel can be improved further by further adding a carbon fiber layer that includes carbon fibers having the same orientation direction as the carbon fiber layer 43*k*. This configuration will be described later with reference to FIG. 12.

Note that in order to clearly show the disposition direction of the carbon fibers 13*h* in the plan views of FIG. 5 and the like, the carbon fibers 13*h* are shown disposed in bands, and the resin is shown with the same width between the bands formed by the carbon fibers 13*h*. However, in actuality the carbon fibers 13*h* are disposed uniaxially, that is to say, in a direction orthogonal to the lengthwise direction of the long sides of the back face panel 43, over the entire face in the plan view, without forming disposed portions and non-disposed portion in a band-like configuration. Also, although FIG. 10 shows a configuration in which the projection portions 43*v*, 43*w*, and 43*x* rise up from resin portions between the carbon fibers, in actuality the carbon fibers 13*h* are not provided independently in a band-like configuration so as to sandwich gap portions with a predetermined width as shown in this figure, but instead the projection portions 43*v*, 43*w*, and 43*x* are formed such that the carbon fibers 13*h* rise up over the entirety of the width direction of the projection portions.

Also, although the projection portions 43*v*, 43*w*, and 43*x* are formed such that the lengthwise direction of the long sides thereof is perpendicular to the lengthwise direction of the long sides of the back face panel 43, they may be formed such that the lengthwise direction of the long sides is parallel with the lengthwise direction of the long sides of the back face panel 43, or oblique to the lengthwise direction of the long sides of the back face panel 43. In each of these configurations, the orientation direction of the carbon fibers 43*h* is set perpendicular to the lengthwise direction of the long sides of the back face panel 43. Although these configurations do not obtain a greater flexural strength than that of the back face panel 43 shown in FIGS. 10 and 11, they can obtain a greater flexural strength than that of a back face panel not including projection portions.

Also, although the first layer 43*m* and the second layer 43*n* are provided in Variation 1, the back face panel 43 can be formed with only the carbon fiber layer 43*k* if the carbon fiber layer 43*k* is formed so as to have a shape equivalent to that of the projection portions 43*w* and the like. This configuration also enables improving the robustness of the second housing 2 and the back face panel 43.

The carbon fiber layer 43*k* is one example of a carbon fiber layer. The carbon fibers 43*h* are one example of carbon fibers. The first layer 43*m* and the second layer 43*n* are examples of a metal layer. The principal face 43*s* is one example of a principal face of the carbon fiber layer or the back face panel. The upper face 43*p* is one example of an upper face of the carbon fiber layer or the back face panel. The outer side of a flat plate portion 43*a* that is in contact with a first wall portion 43*b*, and the outer side of the flat plate portion 43*a* that is in contact with a second wall portion 43*c* are examples of the long sides of the back face panel 43.

Variation 2

Figure 12:
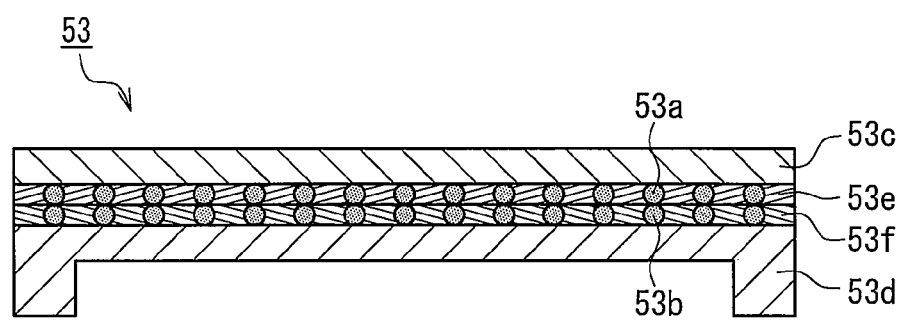
FIG. 12 is a cross-sectional view of a second housing according to Variation 2.

FIG. 12 is a plan view of the configuration of Variation 2 of the back face panel of the present embodiment. Note that in order to clearly show the positions of the carbon fibers, FIG. 12 shows a cross section taken along the lengthwise direction of the long sides of the back face panel (corresponding to a cross section taken along line W-W in FIG. 5, for example).

As shown in FIG. 12, a back face panel 53 includes a first layer 53*c*, a second layer 53*d*, a first carbon fiber layer 53*e*, and a second carbon fiber layer 53*f*. The first layer 53*c* and the second layer 53*d* have a configuration similar to that of the first layer 13*m* and the second layer 13*n* shown in FIG. 6. The first carbon fiber layer 53*e* and the second carbon fiber layer 53*f* have a configuration similar to that of the carbon fiber layer 13*k* shown in FIG. 6. The first carbon fiber layer 53*e* includes first carbon fibers 53*a*. The second carbon fiber layer 53*f* includes second carbon fibers 53*b*. The second carbon fiber layer 53*f* is disposed between the first carbon fiber layer 53*e* and the second layer 53*d*. The first carbon fiber layer 53*e* and the second carbon fiber layer 53*f* are disposed such that the orientation direction of the first carbon fibers 53*a* and the orientation direction of the second carbon fibers 53*b* are perpendicular to the lengthwise direction of the long sides of the back face panel 53. The first carbon fibers 53*a* and the second carbon fibers 53*b* thus are disposed parallel to each other.

Figure 13:
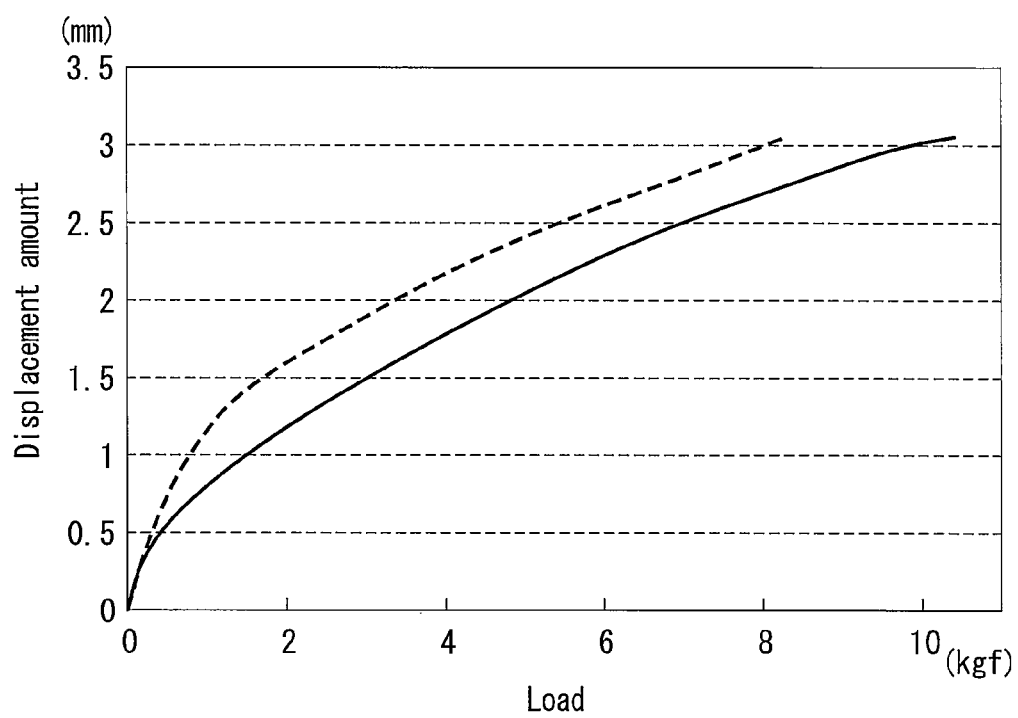
FIG. 13 is a graph of results of a flexural strength test performed on the second housing according to Variation 2.

This configuration enables further raising the flexural strength of the back face panel 53 as shown by the solid line in the flexure test results shown in FIG. 13. Specifically, since the number of carbon fibers in the configuration shown in FIG. 12 is substantially double that of the configuration shown in FIG. 6 and the like, the flexural strength is approximately double the flexural strength of the back face panel 13 (see FIG. 7B) shown in FIG. 6 and the like, and therefore the configuration shown in FIG. 12 is preferable due to the ability to further raise the flexural strength. In this configuration, the two carbon fiber layers 53*e* and 53*f* may be disposed such that the carbon fibers contained in the respective carbon fiber layers overlap each other or do not overlap each other. Note that the testing method that obtained the flexure test results shown in FIG. 13 was similar to the testing method described with reference to FIG. 7B.

Figure 14:
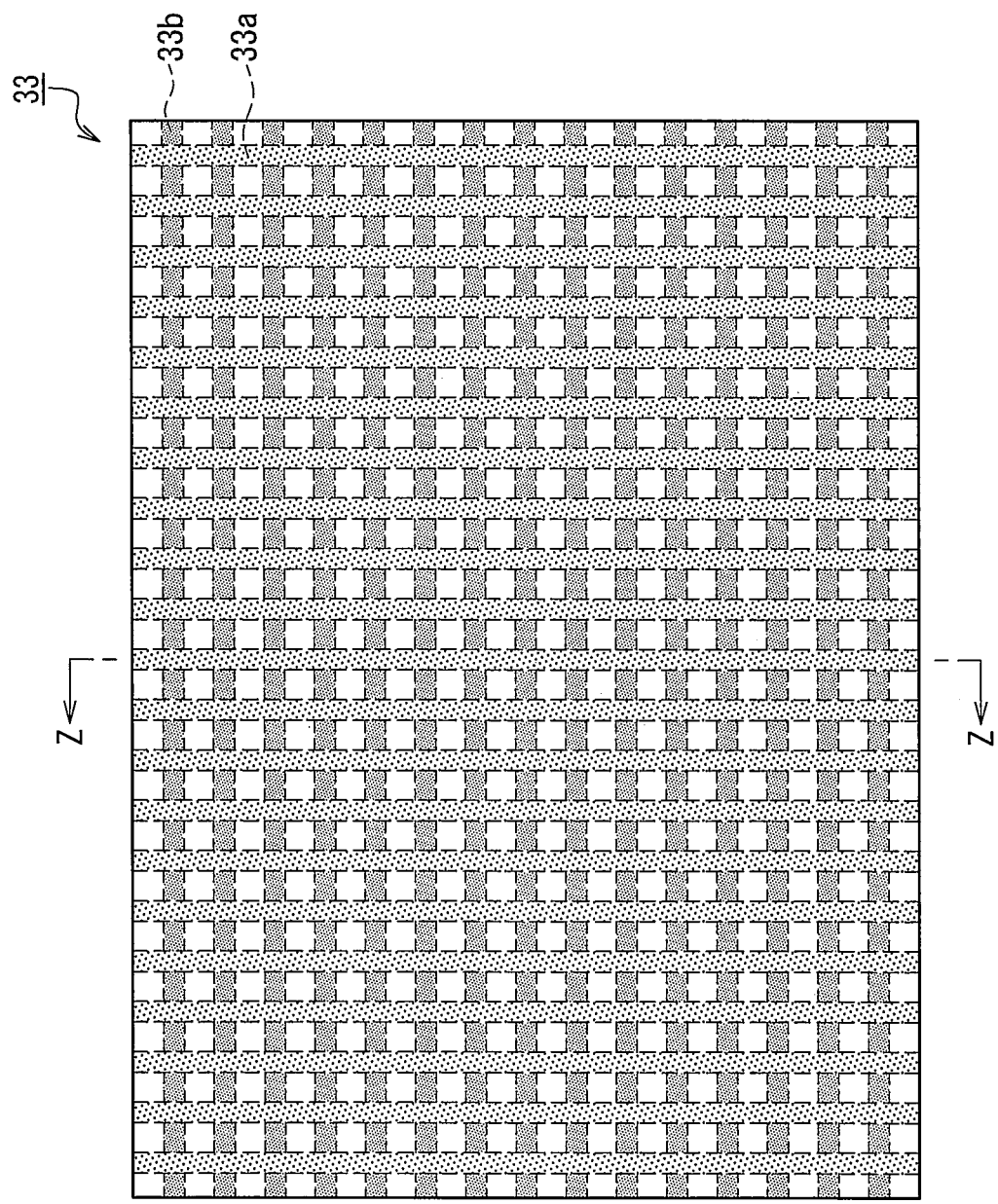
FIG. 14 is a plan view of a second housing in which the carbon fibers are disposed orthogonal to each other.
Figure 15:
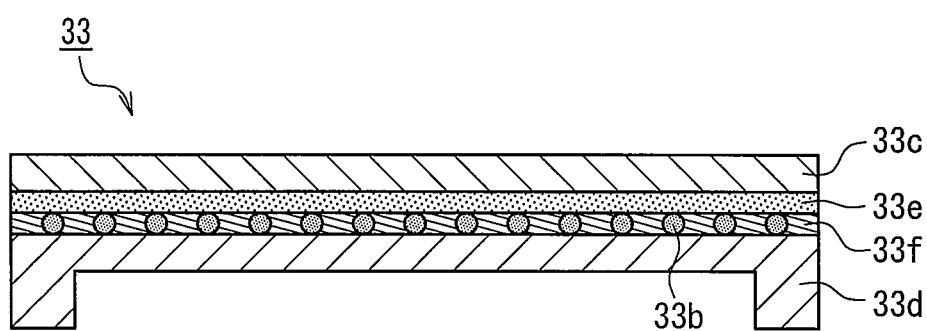
FIG. 15 is a cross-sectional view taken along line Z-Z in FIG. 14.

Note that although the back face panel 53 of Variation 2 is configured including the first carbon fiber layer 53*e* and the second carbon fiber layer 53*f* whose orientation directions are the same direction, a configuration is possible in which in place of the first carbon fiber layer 53*e*, the back face panel 53 is configured including a carbon fiber layer that includes carbon fibers having an orientation direction that is orthogonal to the orientation direction of the second carbon fibers 53*b*. FIG. 14 is a plan view of a back face panel 33 including first carbon fibers 33*a* and second carbon fibers 33*b* whose orientation directions are orthogonal to each other. FIG. 15 is a cross-sectional view taken long line Z-Z in FIG. 14. The back face panel 33 shown in FIGS. 14 and 15 is configured including a first layer 33*c*, a second layer 33*d*, a first carbon fiber layer 33*e*, and a second carbon fiber layer 33*f*. The first carbon fiber layer 33*e* includes the first carbon fibers 33*a*. The second carbon fiber layer 33*f* includes the second carbon fibers 33b. The test results regarding the flexural strength of the back face panel 33 shown in FIGS. 14 and 15 are indicated by a broken line in FIG. 13.

The first carbon fiber layers 33e and 53a and the second carbon fiber layers 33f and 53f are examples of a carbon fiber layer. The first carbon fibers 33a and 53e and the second carbon fibers 33b and 53b are examples of carbon fibers. The first layers 33c and 53c and the second layers 33d and 53d are examples of a metal layer.

Variation 3

Figure 16:
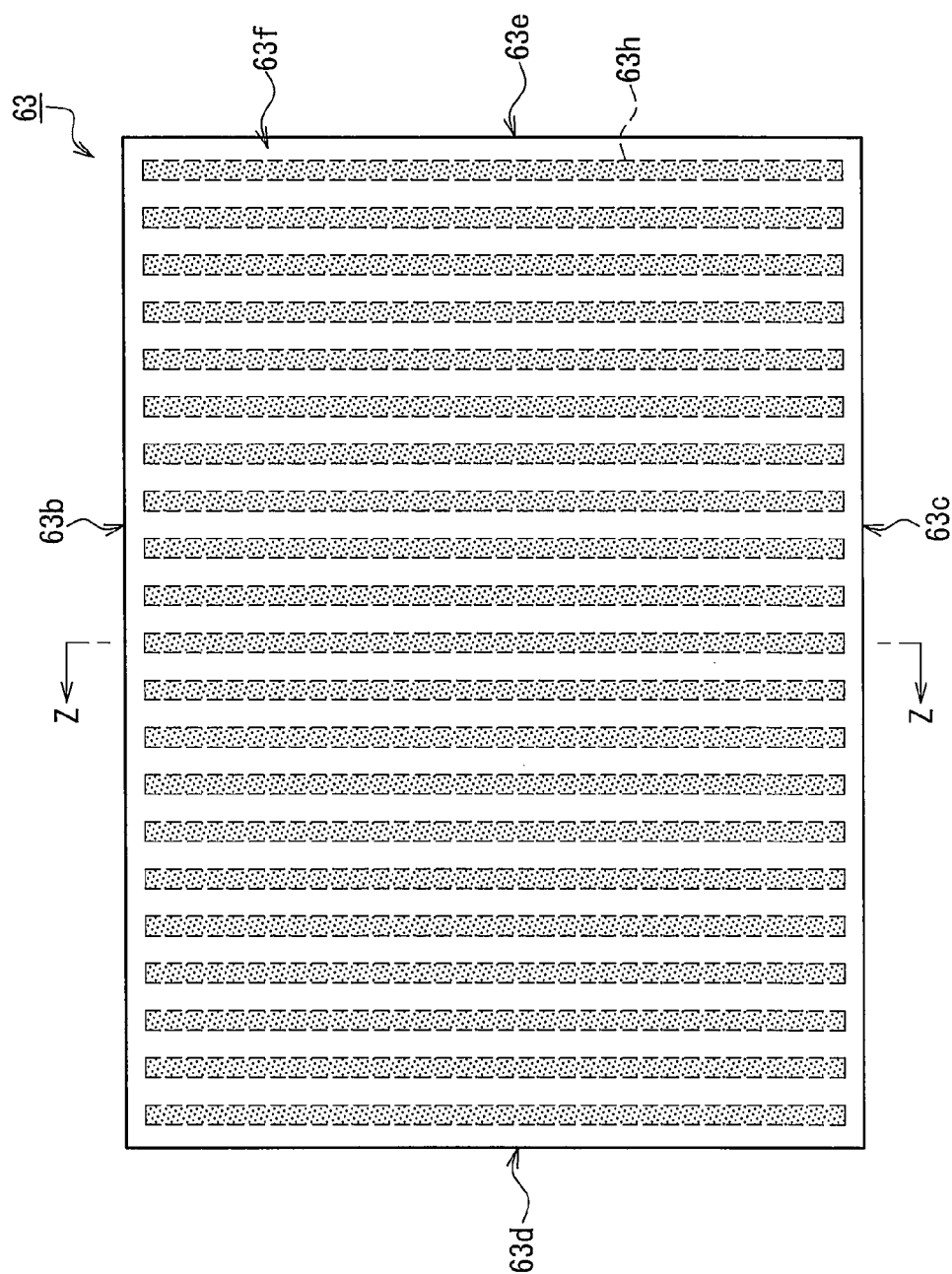
FIG. 16 is a plan view of a second housing according to Variation 3.
Figure 17:
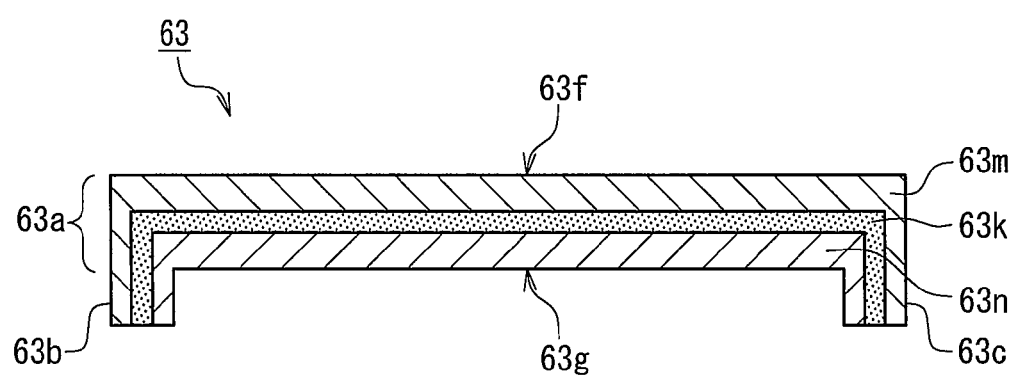
FIG. 17 is a cross-sectional view taken along line Z-Z in FIG. 16.

FIG. 16 is a plan view of Variation 3 of the back face panel of the present embodiment. FIG. 17 is a cross-sectional view taken long line Z-Z in FIG. 16.

Note that the specific configurations of a carbon fiber layer 63k and carbon fibers 63h are similar to the configurations of the carbon fiber layer 13k and the carbon fibers 13h described with reference to FIGS. 5 and 6. The carbon fibers 63h are oriented in one direction, and are long fibers that are continuous in that direction. The carbon fiber layer 63k is configured such that the orientation direction of the carbon fibers 63h is perpendicular to the lengthwise direction of the long sides of a back face panel 63 as shown in FIG. 16 (i.e., parallel to the lengthwise direction of the short sides of the back face panel 63). As shown in FIG. 17, in the vicinity of the pair of long sides of the back face panel 63, the carbon fibers 63h are bent along a first wall portion 63b and a second wall portion 63c. In other words, portions of the carbon fibers 63h are disposed inside the first wall portion 63b and the second wall portion 63c. Note that the carbon fibers 63h shown in FIGS. 16 and 17 are illustrated schematically.

The specific configurations of a first layer 63m and a second layer 63n are similar to the configurations of the first layer 13m and the second layer 13n described with reference to FIGS. 5 and 6.

According to this configuration, it is possible to improve the flexural strength of the first wall portion 63b and the second wall portion 63c of the back face panel 63, thus enabling further improvement in the overall flexural strength of the back face panel 63.

Also, disposing portions of the carbon fibers 63h inside the first wall portion 63b and the second wall portion 63c of the back face panel 63 improves the strength in the planar direction of a principal face 63g and improves the robustness of the second housing 2.

Note that the configuration shown in FIGS. 16 and 17 also can be applied to the back face panel 43 shown in FIGS. 10 and 11, the back face panel 53 shown in FIG. 12, and the back face panel 33 shown in FIGS. 14 and 15, thus enabling further improving the flexural strength of the respective back face panels.

Also, although the first layer 63m and the second layer 63n are provided in Variation 3, the back face panel 63 can be formed using only the carbon fiber layer 63k. This configuration enables reducing the weight of the second housing 2 and the back face panel 63. This configuration also enables simplifying the processing and manufacturing of the second housing 2 and the back face panel 63.

The back face panel 63 is one example of a housing. The carbon fiber layer 63k is one example of a carbon fiber layer. The carbon fibers 63h are one example of carbon fibers. The first layer 63m and the second layer 63n are examples of a metal layer. The outer side of a flat plate portion 63a that is in contact with the first wall portion 63b, and the outer side of the flat plate portion 63a that is in contact with the second wall portion 63c are examples of the long sides of the back face panel 63.

The present invention is useful to a housing. The present invention is also useful to an electronic device including a housing.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A housing, comprising:
   a carbon fiber layer comprising a carbon fiber reinforced plastic,
   the carbon fiber layer having a planar shape that has at least a pair of long sides, and containing carbon fibers that have one orientation direction,
   the carbon fiber layer being disposed such that the orientation direction of the carbon fibers is perpendicular to a lengthwise direction of the long sides,
   wherein the carbon fiber layer comprises:
   a projection portion having an upper face that projects out from a principal face,
   the upper face is rectangular in shape, and
   the upper face is formed such that a lengthwise direction of the rectangular shape conforms to the orientation direction of the carbon fibers.

2. The housing according to claim 1, wherein a metal layer is joined to at least one of a first face and a second face of the carbon fiber layer.

3. An electronic device comprising a housing according to claim 1.

* * * * *